US010396174B2

(12) United States Patent
Zhou

(10) Patent No.: US 10,396,174 B2
(45) Date of Patent: Aug. 27, 2019

(54) STI-DIODE STRUCTURE

(71) Applicants: SEMICONDUCTOR MANUFACTURING INTERNATIONAL (SHANGHAI) CORPORATION, Shanghai (CN); SEMICONDUCTOR MANUFACTURING INTERNATIONAL (BEIJING) CORPORATION, Beijing (CN)

(72) Inventor: Fei Zhou, Shanghai (CN)

(73) Assignees: SEMICONDUCTOR MANUFACTURING INTERNATIONAL (SHANGHAI) CORPORATION, Shanghai (CN); SEMICONDUCTOR MANUFACTURING INTERNATIONAL (BEIJING) CORPORATION, Beijing (CN)

( * ) Notice: Subject to any disclaimer, the term of this patent is extended or adjusted under 35 U.S.C. 154(b) by 0 days.

(21) Appl. No.: 15/918,674

(22) Filed: Mar. 12, 2018

(65) Prior Publication Data
US 2018/0323275 A1 Nov. 8, 2018

(30) Foreign Application Priority Data

May 8, 2017 (CN) .......................... 2017 1 0315143

(51) Int. Cl.
H01L 29/66 (2006.01)
H01L 29/861 (2006.01)
(Continued)

(52) U.S. Cl.
CPC ........ H01L 29/6609 (2013.01); H01L 21/266 (2013.01); H01L 21/26513 (2013.01);
(Continued)

(58) Field of Classification Search
CPC ............ H01L 29/0688; H01L 29/6609; H01L 29/66098; H01L 29/66136; H01L 29/8613; H01L 27/0255
See application file for complete search history.

(56) References Cited

U.S. PATENT DOCUMENTS 7,973,334 B2 * 7/2011 Verleye ............... H01L 27/0262
257/173
8,779,518 B2 * 7/2014 Lin ..................... H01L 27/0255
257/328
(Continued)

FOREIGN PATENT DOCUMENTS

WO WO 2017/184695 * 10/2017 ............. H01L 27/02
WO WO 2017/212644 * 12/2017 ........... H01L 21/822

OTHER PUBLICATIONS

Machine translation, Okubo, WIPO Pat. Pub. No. WO 2017/212644, translation date: Jan. 24, 2019, Espacenet, all pages. (Year: 2017).*

Primary Examiner — Victoria K. Hall
(74) Attorney, Agent, or Firm — Kilpatrick Townsend & Stockton LLP

(57) ABSTRACT

A method for manufacturing a fin-type diode includes providing a substrate structure including a substrate, first and second sets of fins on the substrate, an isolation region between the first and second sets of fins and having an upper surface lower than an upper surface of the first and second set of fins, a well region partially in the substrate and overlapping the first and second sets of fins. The method also includes forming a dielectric layer on the first and second sets of fins, forming a dummy gate structure covering the dielectric layer on an end of the second set of fins and the upper surface of the isolation region, doping the first set of fins to form a first doped region, and doping the second set (Continued)

of fins and a portion of the well region below the second set of fins to form a second doped region.

16 Claims, 7 Drawing Sheets

(51) Int. Cl.
  *H01L 21/265* (2006.01)
  *H01L 21/266* (2006.01)
  *H01L 27/02* (2006.01)
  *H01L 21/762* (2006.01)
  *H01L 29/06* (2006.01)
  *H01L 29/78* (2006.01)
  *H01L 29/165* (2006.01)

(52) U.S. Cl.
  CPC .... *H01L 21/76224* (2013.01); *H01L 27/0255* (2013.01); *H01L 29/0649* (2013.01); *H01L 29/0657* (2013.01); *H01L 29/0688* (2013.01); *H01L 29/66136* (2013.01); *H01L 29/861* (2013.01); *H01L 29/8613* (2013.01); *H01L 29/165* (2013.01); *H01L 29/66795* (2013.01); *H01L 29/785* (2013.01)

(56) References Cited

U.S. PATENT DOCUMENTS

| | | | |
|---|---|---|---|
| 9,117,669 B2* | 8/2015 | Lin | H01L 27/0255 |
| 9,318,621 B2* | 4/2016 | Chang | H01L 29/0692 |
| 9,947,649 B1* | 4/2018 | Balakrishnan | H01L 27/0255 |
| 10,079,228 B1* | 9/2018 | Balakrishnan | H01L 27/0255 |
| 10,096,589 B2* | 10/2018 | Lin | H01L 27/0255 |
| 10,153,271 B2* | 12/2018 | Li | H01L 21/823842 |
| 2009/0001472 A1* | 1/2009 | Salman | H01L 27/0255 257/355 |
| 2014/0117490 A1* | 5/2014 | Yamashita | H01L 27/0255 257/506 |
| 2014/0151809 A1* | 6/2014 | Lin | H01L 27/0255 257/355 |
| 2019/0081032 A1* | 3/2019 | Okubo | H01L 21/822 |
| 2019/0081036 A1* | 3/2019 | Li | H01L 21/823842 |

\* cited by examiner

STI-DIODE STRUCTURE

CROSS-REFERENCES TO RELATED APPLICATIONS

The present application claims priority to Chinese patent application No. 201710315143.5, filed with the State Intellectual Property Office of People's Republic of China on May 8, 2017, the content of which is incorporated herein by reference in its entirety.

FIELD OF THE INVENTION

The present application relates to integrated semiconductor devices, and more particularly to a fin-type diode and a method for manufacturing the same.

BACKGROUND OF THE INVENTION

As the critical dimension of metal oxide semiconductor field effect transistor (MOSFET) devices continues to shrink, the short channel effect becomes more problematic. Fin field effect transistor (FinFET) devices have better control capability of gates than planar MOSFET devices to effectively suppress the short channel effect. Thus, FinFET devices are generally used in the design of small-sized semiconductor devices.

Electrostatic discharge (ESD) is a serious problem for semiconductor devices, especially for FinFET devices that are more susceptible to electrostatic discharge due to the smaller size of the devices.

A diode-type ESD device is a shallow-trench isolation (STI) fin-type diode that forms a PN junction in a fin, and the discharge current flows out the narrow fin. However, in the case where the discharge current is relatively large, the large current flowing through the narrow fin forms local hot spots that cause damage to the fin and reduce the robustness of the diode.

BRIEF SUMMARY OF THE INVENTION

It is an object of the present disclosure to provide a fin-type diode and a method for manufacturing the same.

According to an aspect of the present disclosure, a method for manufacturing a fin-type diode may include providing a substrate structure including a substrate, a first set of fins on the substrate, a second set of fins on the substrate, an isolation region disposed between the first set of fins and the second set of fins and having an upper surface lower than an upper surface of the first set of fins and an upper surface of the second set of fins, and a well region partially in the substrate and overlapping the first set of fins and the second set of fins, or the well region entirely in the substrate and overlapping the first set of fins and the second set of fins. The method also includes forming a dielectric layer on a surface of first set of fins and on a surface of the second set of fins above the upper surface of the isolation region, forming a dummy gate structure covering a portion of the dielectric layer on a distal end of the second set of fins and the upper surface or a portion of the upper surface of the isolation region, performing a first dopant implantation on the first set of fins to form a first doped region, and performing a second dopant implantation on the second set of fins and a portion of the well region below the second set of fins using the dummy gate structure as a mask to form a second doped region. The first doped region and the second doped region have different conductivity types. The first doped region and the well region have a same conductivity type.

In one embodiment, the dummy gate structure further covers a portion of the dielectric layer on a distal end of the first set of fins.

In one embodiment, the dummy gate structure includes a dummy gate covering the portion of the dielectric layer on the distal end of the second set of fins and the upper surface or a portion of the upper surface of the isolation region, a hardmask layer on the dummy gate, and a spacer layer on an upper surface and sidewalls of the hardmask layer and sidewalls of the dummy gates.

In one embodiment, the first doped region is adjacent to the well region.

In one embodiment, the first doped region includes a dopant concentration greater than a dopant concentration of the well region.

In one embodiment, the method further includes etching a portion of the first doped region to form a first recess, and epitaxially forming a first semiconductor material in the first recess to form a first epitaxial region.

In one embodiment, the method also includes etching a portion of the second doped region to form a second recess, and epitaxially forming a second semiconductor material in the first recess to form a second epitaxial region.

In one embodiment, providing the substrate structure includes providing an initial substrate structure including the substrate, the first set of fins and the second set of fins, and an insulating material layer on the substrate and the first set of fins and the second set of fins, performing an ion implantation on a portion of the initial substrate structure to form the well region, and removing a portion of the insulating material layer to form the isolation region.

Embodiments of the present invention also provide a fin-type diode. The fin-type diode includes a substrate, a first set of fins on the substrate, a second set of fins on the substrate, an isolation region disposed between the first set of fins and the second set of fins and having an upper surface lower than an upper surface of the first set of fins and an upper surface of the second set of fins, a dielectric layer on a surface of the first set of fins above the isolation region and a surface of the second set of fins above the isolation region, a well region partially in the substrate and overlapping the first set of fins and the second set of fins, or the well region entirely in the substrate and overlapping the first set of fins and the second set of fins. The fin-type diode also includes a first doped region including an upper portion of the first set of fins and adjacent to the well region, a second doped region including the second set of fins and a portion of the well region below the second set of fins, a junction formed by the second doped region and the well region and having a junction interface disposed in the substrate, and a dummy gate structure covering a portion of the dielectric layer on a distal end of the second set of fins and the upper surface or a portion of the upper surface of the isolation region. The first doped region and the second doped region have different conductivity types. The first doped region and the well region have a same conductivity type.

In one embodiment, the dummy gate structure further covers a portion of the dielectric layer on a distal end of the first set of fins.

In one embodiment, the dummy gate structure includes a dummy gate covering the portion of the dielectric layer on the distal end of the second set of fins and the upper surface or a portion of the upper surface of the isolation region, a hardmask layer on the dummy gate, and a spacer layer on an upper surface and sidewalls of the hardmask layer and sidewalls of the dummy gates.

In one embodiment, the first doped region includes a dopant concentration greater than a dopant concentration of the well region.

In one embodiment, the fin-type diode further includes a first recess in the first doped region, and a first epitaxial region including a first semiconductor material epitaxially grown in the first recess.

In one embodiment, the fin-type diode also includes a second recess in the second doped region, and a second epitaxial region including a second semiconductor material epitaxially grown in the second recess.

In one embodiment, the first set of fins include a plurality of first fins, and the second set of fins include a plurality of second fins.

The following detailed description together with the accompanying drawings will provide a better understanding of the nature and advantages of the present invention.

BRIEF DESCRIPTION OF THE DRAWINGS

The accompanying drawings, referred to herein and constituting a part hereof, illustrate embodiments of the disclosure. The drawings together with the description serve to explain the principles of the invention.

DETAILED DESCRIPTION OF THE INVENTION

Figure 1:
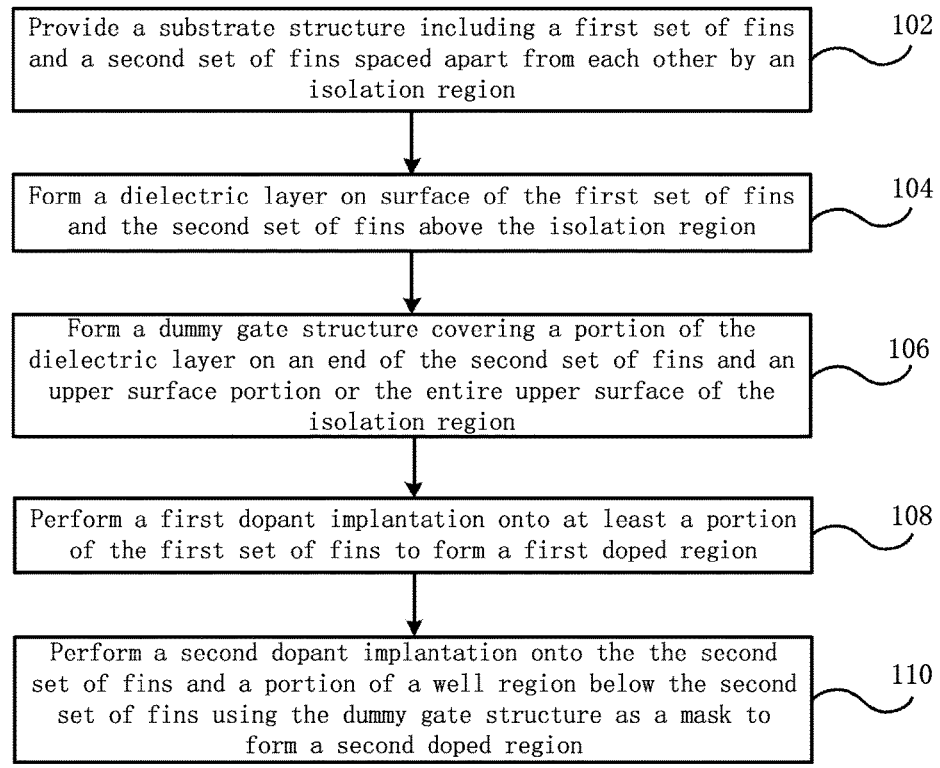
FIG. 1 is a simplified flowchart of a method for manufacturing a fin-type diode according to some embodiments of the present disclosure.

Embodiments of the present disclosure now will be described more fully hereinafter with reference to the accompanying drawings. The disclosure may, however, be embodied in many different forms and should not be construed as limited to the embodiments set forth herein. Rather, these embodiments are provided so that this disclosure will be thorough and complete, and will fully convey the scope of the invention to those skilled in the art. The features may not be drawn to scale, some details may be exaggerated relative to other elements for clarity. Like numbers refer to like elements throughout.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "lateral" or "vertical" may be used herein to describe a relationship of one element, layer or region to another element, layer or region as illustrated in the figures. It will be understood these terms are intended to encompass different orientations of the device in addition to the orientation depicted in the figures.

The terminology used herein is for the purpose of describing particular embodiments only and is not intended to be limiting of the invention. As used herein, the singular forms "a", "an", and "the" are intended to include the plural forms as well, unless the context clearly indicates otherwise. It will be further understood that the terms "comprises", "comprising", "includes", and/or "including" when used herein, specify the presence of stated features, integers, steps, operations, elements, and/or components, but do not preclude the presence or addition of one or more other features, integers, steps, operations, elements, components, and/or groups thereof.

Embodiments of the disclosure are described herein with reference to cross-sectional illustrations that are schematic illustrations of idealized embodiments (and intermediate structures) of the invention. The thickness of layers and regions in the drawings may be enlarged relative to other layers and regions for clarity. Additionally, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a discrete change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

References in the specification to "one embodiment", "an embodiment", "an example embodiment", "some embodiments", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

Embodiments of the present disclosure now will be described more fully hereinafter with reference to the accompanying drawings, in which embodiments of the invention are shown. This disclosure may, however, be embodied in many different forms and should not be construed as limited to the embodiments set forth herein.

FIG. 1 is a simplified flowchart of a method for manufacturing a fin-type diode according to some embodiments of the present disclosure.

Referring to FIG. 1, at step 102, a substrate structure is provided.

Figure 2A:
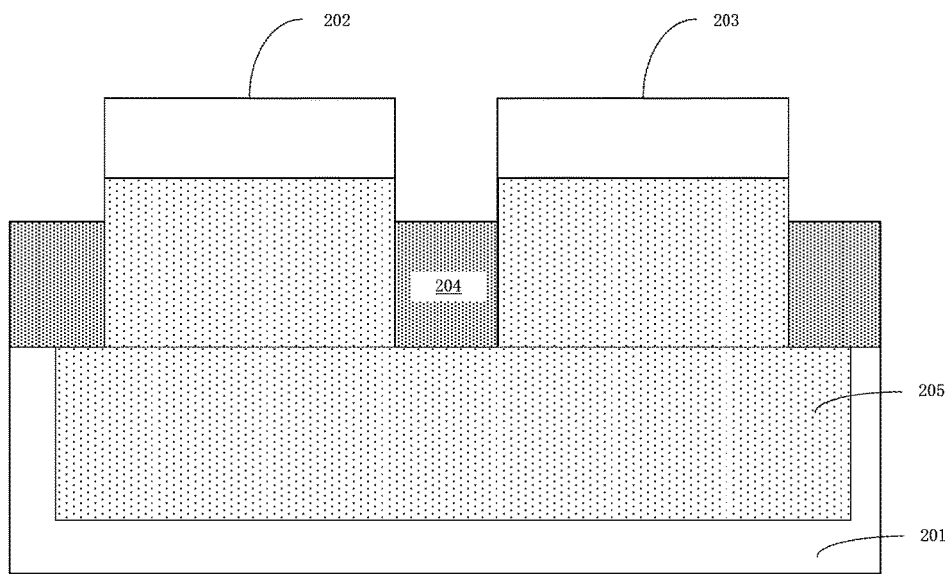
FIG. 2A is a cross-sectional view of a substrate structure according to one embodiment of the present disclosure.

FIG. 2A is a cross-sectional view of a substrate structure according to one embodiment of the present disclosure. Referring to FIG. 2A, the substrate structure includes a substrate 201, a first set of fins 202 on substrate 201, a second set of fins 203 on substrate 201, and an isolation region 204 disposed between first set of fins 202 and second set of fins 203. Isolation region 204 has an upper surface lower than an upper surface of first set of fins 202 and second set of fins 203.

The substrate structure also includes a well region 205. Well region 205 partially overlaps substrate 201, first set of fins 202, and second set of fins 203. That is, well region 205 includes a portion of substrate 201, a portion of first set of fins 202, and a portion of second set of fins 203 that are adjacent to the portion of substrate 201.

Figure 2B:
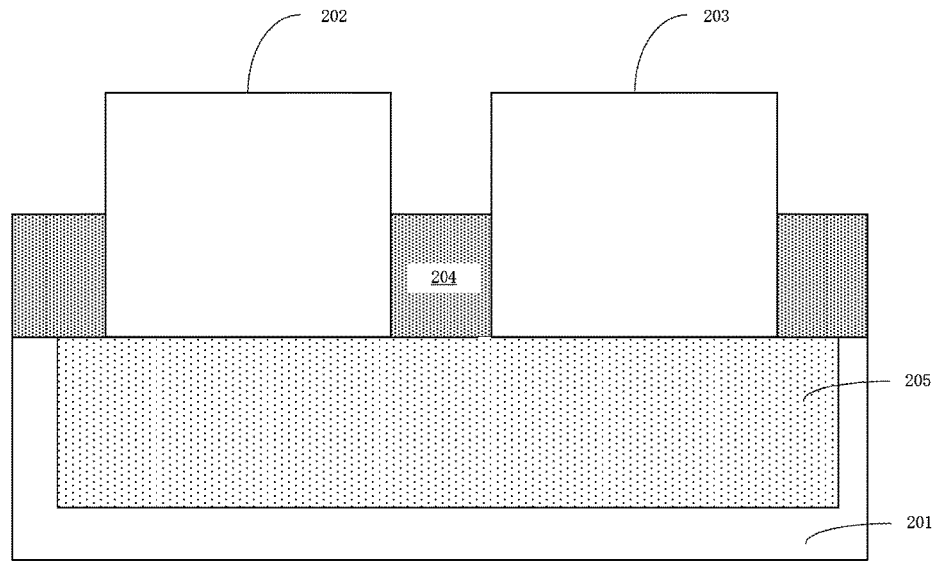
FIG. 2B is a cross-sectional view of a substrate structure according to another embodiment of the present disclosure.

FIG. 2B is a cross-sectional view of a substrate structure according to another embodiment of the present disclosure. Comparing with the substrate structure shown in FIG. 2A, well region 205 in the substrate structure of FIG. 2B is entirely in substrate 201 and adjacent to first set of fins 202 and second set of fins 203.

Figure 2C:
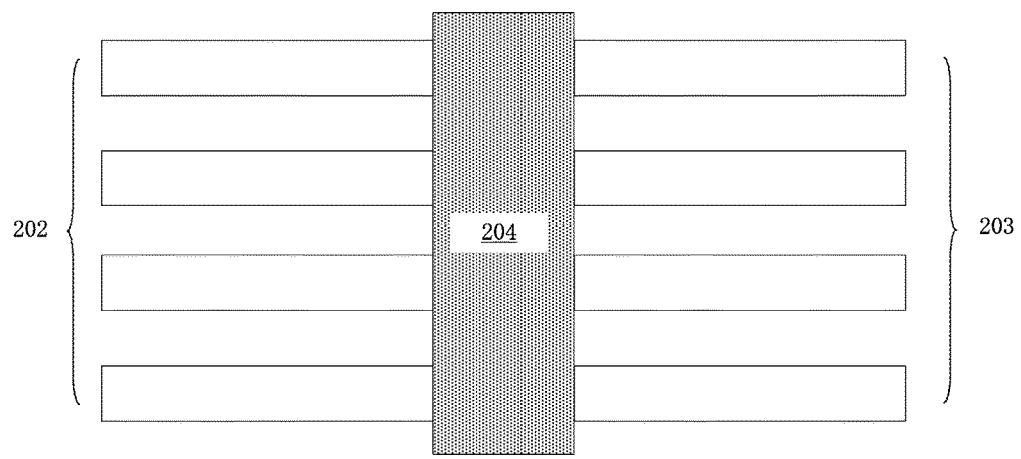
FIG. 2C is a top plan view illustrating a positional relationship between a first set of fins and a second set of fins according to one embodiment of the present disclosure.

FIG. 2C is a top plan view illustrating a positional relationship between the first set of fins and the second set of fins according to one embodiment of the present disclosure. Referring to FIG. 2C, first set of fins 202 and second set of fins 203 are spaced apart from each other by isolation region 204 in the direction extending along the fins (also referred to as the longitudinal direction). In one embodiment, first set of fins 202 includes a plurality of first fins, and second set of fins 203 includes a plurality of second fins. The first fins and the second fins are spaced apart from each other by an isolation structure.

In one embodiment, the substrate structure shown in FIGS. 2A and 2B may be formed by the following process steps: Firstly, an initial substrate structure is provided. The initial substrate structure may include a substrate 201, a first set of fins 202 and a second set of fins 203 on the substrate, and an insulating material layer covering substrate 201, first set of fins 202, and second set of fins 203. Substrate 201 may be an elemental semiconductor substrate such as a silicon substrate or a germanium substrate, or a compound semiconductor substrate such as gallium arsenide. In one embodiment, first set of fins 202 and second set of fins 203 may be formed by etching substrate 201. Alternatively, first set of fins 202 and second set of fins 203 may be formed by epitaxially growing a semiconductor material on substrate 201.

Thereafter, a portion of the initial substrate structure is doped, e.g., by performing an ion implantation to form a well region 205. Herein, the implantation conditions of the ion implantation may be adjusted to form a well region 205 as shown in FIG. 2A or a well region 205 as shown in FIG. 2B. In one embodiment, well region 205 may be a P-well. In another embodiment, well region 205 may be an N-well. Since first set of fins 202 and second set of fins 203 are covered with an insulating material layer, damage to first set of fins 202 and second set of fins 203 may be reduced when well region 205 is formed.

Thereafter, a portion of the insulating material layer is removed to form an isolation region 204 and expose a portion of first set of fins 202 and a portion of second set of fins 203. Isolation region 204 thus has an upper surface lower than an upper surface of first set of fins 202 and an upper surface of second set of fins.

Figure 3:
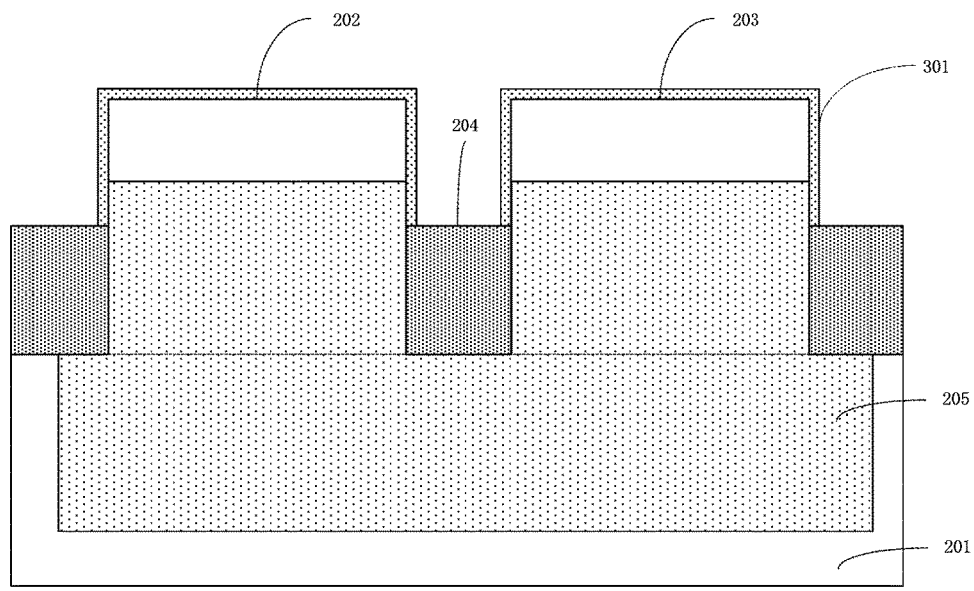
FIG. 3 is a cross-sectional view illustrating a formed dielectric layer according to one embodiment of the present disclosure.

Referring back to FIG. 1, at step 104, a dielectric layer 301 (e.g., silicon oxide layer) is formed on the surface of first set of fins 202 and second set of fins 203 above isolation region 204, as shown in FIG. 3. It is noted that FIG. 3 is a cross-sectional view of the substrate structure after forming dielectric layer 301 on the substrate structure shown in FIG. 2A. Subsequent processes will be described later with reference to FIG. 2A.

Next, at step 106, a dummy gate structure 401 is formed on the substrate structure shown in FIG. 3. In one embodiment, referring to FIG. 4A, dummy gate structure 401 covers a portion of dielectric layer 301 on a distal end of second set of fins 203 and an upper surface of isolation region 204. In another embodiment, referring to FIG. 4B, dummy gate 401 covers a portion of dielectric layer 301 on a distal end of second set of fins 203 and an upper surface portion of isolation region 204. In yet another embodiment, referring to FIG. 4C, dummy gate structure 401 covers a portion of dielectric layer 301 on a distal end of second set of fins 203, the upper surface of isolation region 204, and a portion of dielectric layer 301 on a distal end of first set of fins 202.

In one embodiment, dummy gate structure 401 may include a dummy gate (e.g., polysilicon dummy gate) 411. Dummy gate 411 may cover dielectric layer 301 on a distal end of second set of fins 203 and an upper surface of isolation region 204 (referring to FIG. 4A). Alternatively, dummy gate 411 may cover dielectric layer 301 on a distal end of second set of fins 203 and a portion of the upper surface of isolation region 204 (referring to FIG. 4B). Or, dummy gate 411 may cover dielectric layer 301 on a distal end of second set of fins 203, the upper surface of isolation region 204, and a portion of dielectric layer 301 on a distal end of first set of fins 202 (referring to FIG. 4C). Dummy gate structure 401 may further include a hardmask layer (e.g., a silicon nitride layer) 421 on dummy gate 411. Dummy gate structure 401 may also include a spacer layer (e.g., silicon nitride layer) 431 on the upper surface and sidewalls of hardmask layer 421 and on sidewalls of dummy gate 411.

Figure 4A:
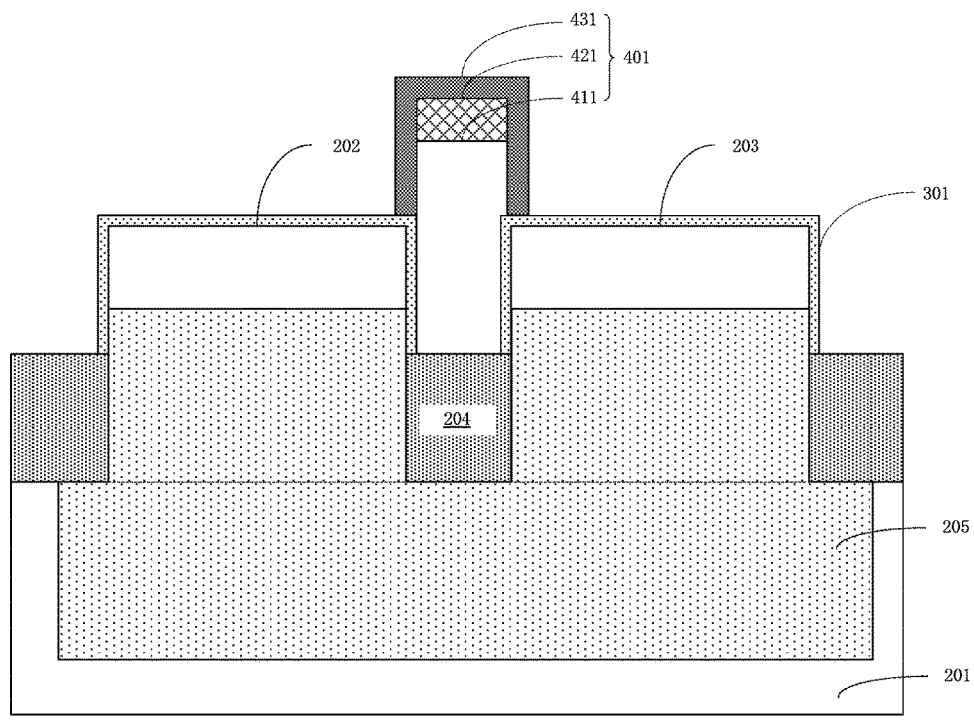
FIG. 4A is a cross-sectional view illustrating a dummy gate structure according to one embodiment of the present disclosure.
Figure 4B:
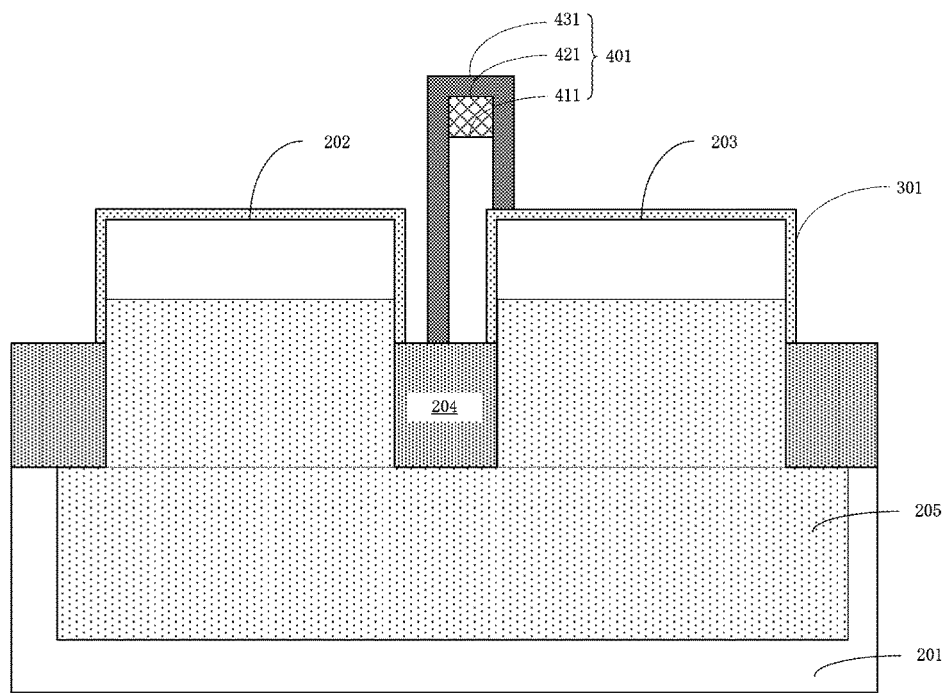
FIG. 4B is a cross-sectional view illustrating a dummy gate structure according to another embodiment of the present disclosure.
Figure 4C:
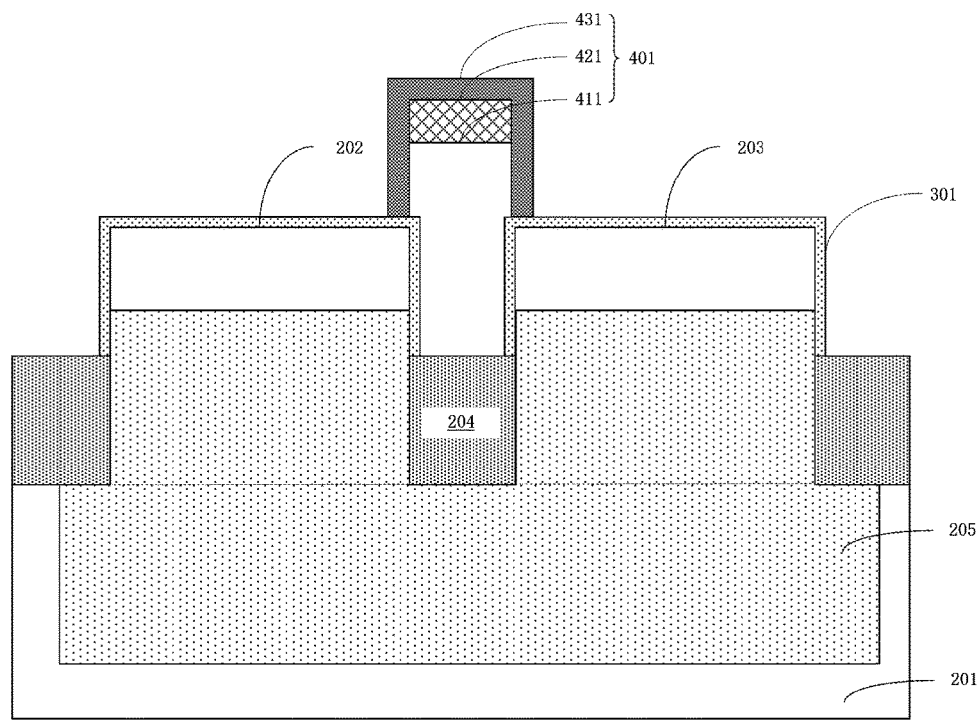
FIG. 4C is a cross-sectional view illustrating a dummy gate structure according to yet another embodiment of the present disclosure.

Note that subsequent processes will be described with reference to FIG. 4A.

Figure 5:
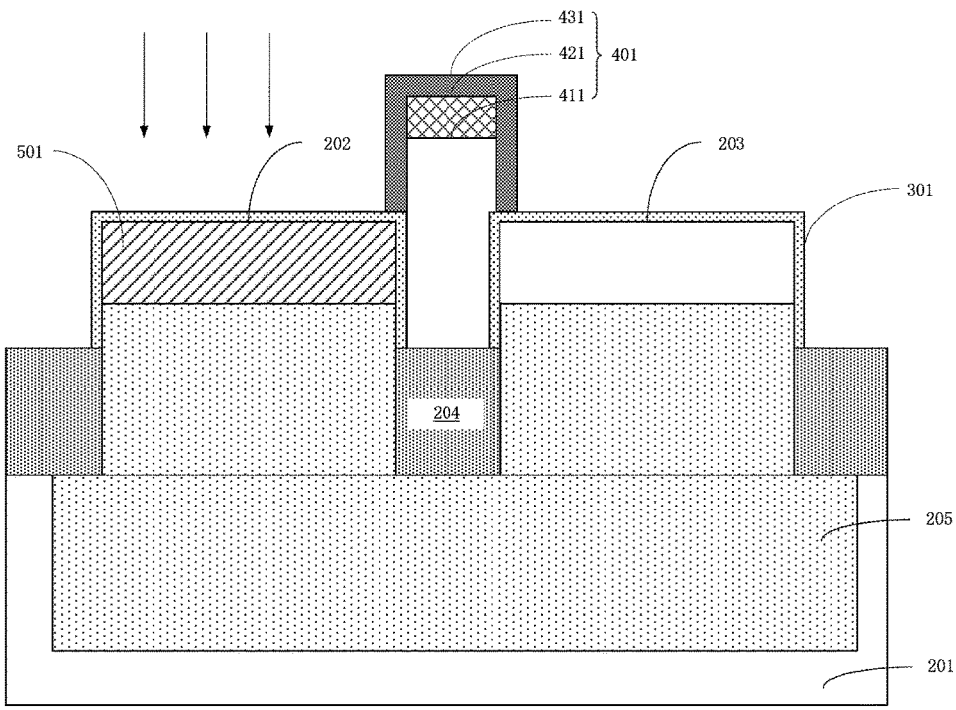
FIG. 5 is a cross-sectional view illustrating the forming of a first doped region according to one embodiment of the present disclosure.

Next, at step 108, a first dopant implantation is performed on at least a portion of first set of fins 202 to form a first doped region 501, as shown in FIG. 5. First doped region 501 is of the same conductivity type as well region 205. In one embodiment, first doped region 501 is a P-type doped region. In another embodiment, first doped region 501 is an N-type doped region.

In one embodiment, a mask layer may be formed on second set of fins 203 and isolation region 204, and the first dopant implantation is performed using the mask layer as a mask. In one embodiment, the first dopant implantation includes boron ions or boron difluoride ions, with an implantation dose of $1.0\times10^{14}$ to $1.0\times10^{16}$ atoms/cm$^2$ (e.g., $5.0\times10^{14}$ atoms/cm$^2$, $1.0\times10^{15}$ atoms/cm$^2$, $5.0\times10^{15}$ atoms/cm$^2$), and an implant energy in the range between 1 keV and 10 keV (e.g., 3 keV, 5 keV, 8 keV).

In some embodiments, first doped region 501 is adjacent to well region 205. In other words, the first dopant implantation is performed on a portion of first set of fins 202 to form a first doped region 501 adjacent to well region 205. In some other embodiments, the first dopant implantation is performed on entire first set of fins 202 to form a first doped region 501 that overlaps well region 205. In one embodiment, the dopant concentration of first doped region 501 is greater than the dopant concentration of well region 205.

Figure 6:
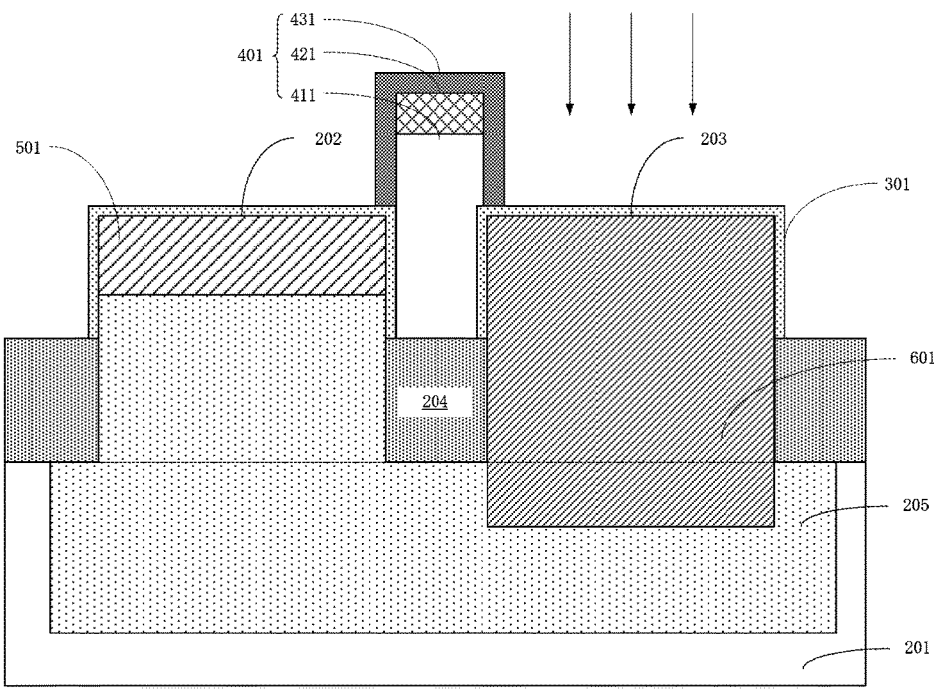
FIG. 6 is a cross-sectional view illustrating the forming of a second doped region according to one embodiment of the present disclosure.

Next, at step 110, a second dopant implantation is performed on second set of fins 203 and a portion of well region 205 below second set of fins 203 using dummy gate structure 401 as a mask to form a second doped region 601, as shown in FIG. 6. First doped region 501 and second doped region 601 have different conductivity types. For example, first doped region 501 has a P-type conductivity, second doped region 601 has an N-type conductivity, and vice versa. Second doped region 601 forms a junction adjacent to well region 205, the junction interface is located in substrate 201, which increases the surface area of the junction compared to conventional approaches. The increased junction surface area facilitates an ESD current to pass through the PN junction, thereby reducing damage to the fins and improving the diode performance.

In one embodiment, the second dopant implantation includes arsenic ions or phosphorous ions, with an implantation dose of $1.0\times10^{14}$ to $5.0\times10^{15}$ atoms/cm$^2$ (e.g., $5.0\times10^{14}$ atoms/cm$^2$, $1.0\times10^{15}$ atoms/cm$^2$), and an implant energy in the range between 80 keV and 300 keV (e.g., 100 keV, 150 keV, 250 keV).

In one embodiment, a mask layer may be formed over first set of fins 202 and isolation region 204, the second dopant implantation is then performed on second set of fins and a portion of well region 205 below second set of fins using the mask layer as a mask. Here, the mask layer may inevitably be subjected to misalignment, thus, when performing the second dopant implantation, ions need to be implanted deeper into second set of fins, in this case, the implanted ions are likely implanted into isolation region 204, and then through isolation region 204 into well region 205 below isolation region 204, such that a junction is formed by second doped region 601 and well region 205 disposed below isolation region 204, thereby reducing the ESD current flow path, which adversely affects the discharge of the ESD current.

Based on the above considerations, the method of the above-described embodiment of the present disclosure includes forming a dummy gate structure 401. Since dummy gate structure 401 covers at least the end portion of second set of fins 203, so that even when a misalignment of the mask occurs at the time of the second dopant implantation, the dummy gate structure prevents dopants from entering into the portion of well region 205 below isolation region 204. As a result, the junction formed by second doped region 601 and well region 205 is not formed below isolation region 204, thereby improving the discharge effect of the diode.

Figure 7:
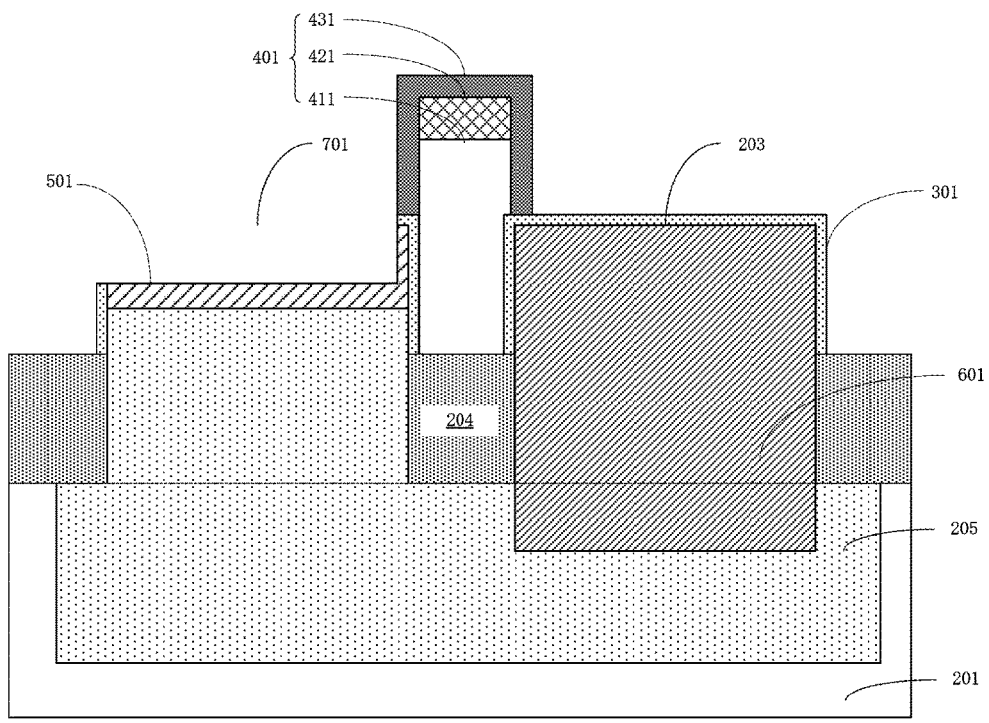
FIG. 7 is a cross-sectional view illustrating a first recess according to one embodiment of the present disclosure.

Next, referring to FIG. 7, the method may include performing an etching process on first doped region 501 to form a first recess 701. It will be appreciated that a portion of dielectric layer 301 on the surface of first set of fins 202 is also removed by the etching process.

Figure 8:
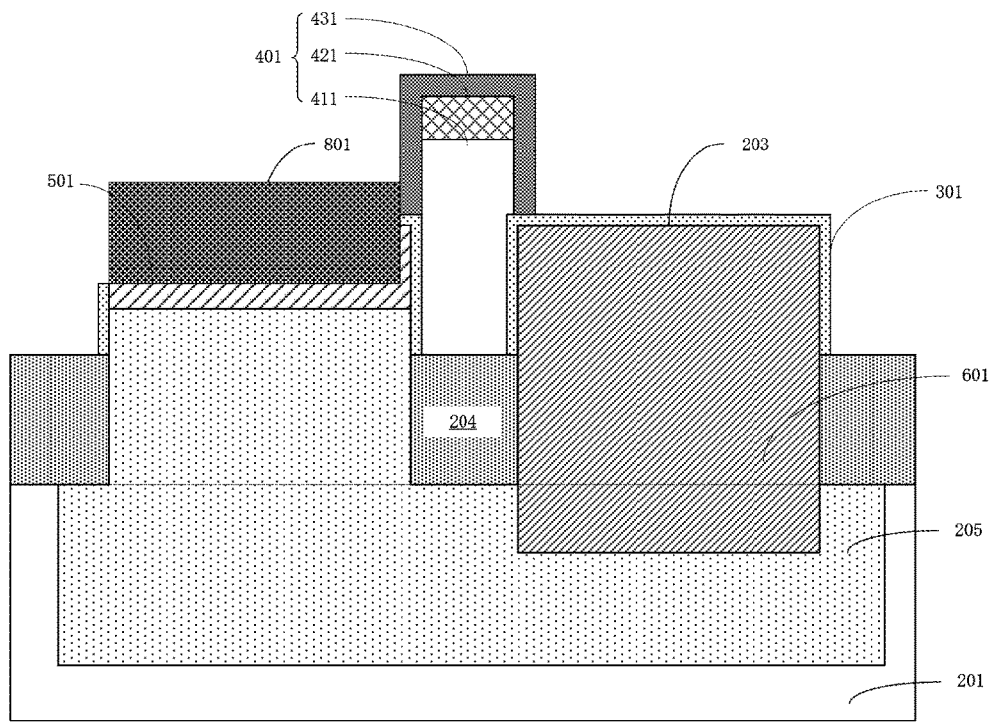
FIG. 8 is a cross-sectional view illustrating the forming of a first epitaxial region according to one embodiment of the present disclosure.

Next, referring to FIG. 8, a first semiconductor material is epitaxially grown in first recess 701 to form a first epitaxial region 801. In one embodiment, first doped region 501 is a P-type conductivity region, and the first semiconductor material may be SiGe. In one embodiment, P-type dopants (e.g., boron) may be implanted in-situ into the first semiconductor material when epitaxially growing the first semiconductor material.

Figure 9:
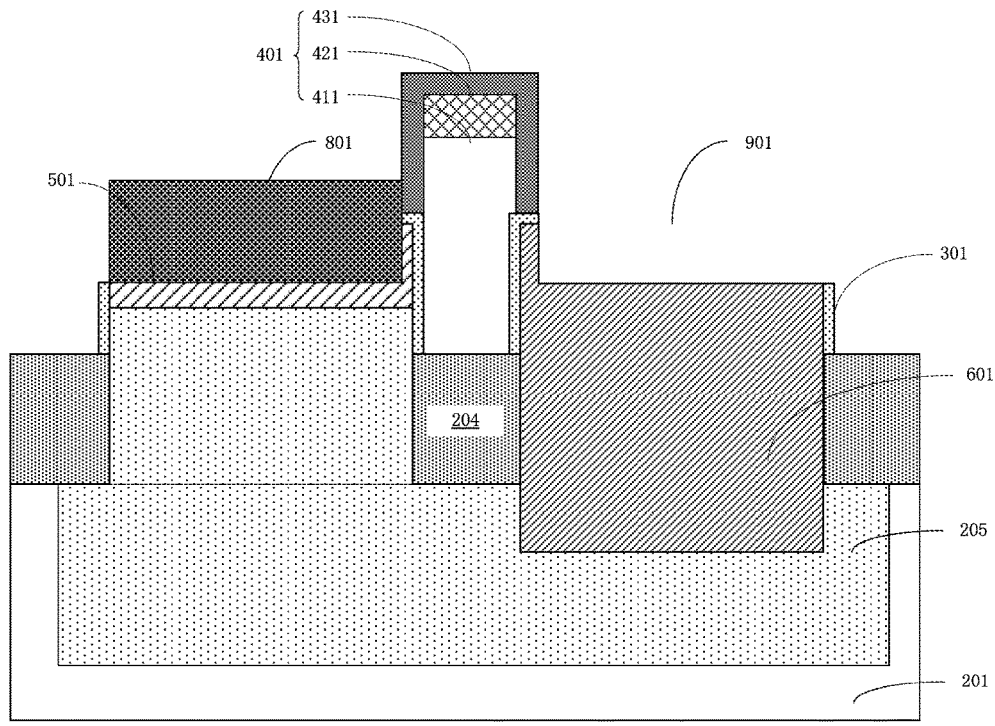
FIG. 9 is a cross-sectional view illustrating a second recess according to one embodiment of the present disclosure.

Next, referring to FIG. 9, the method may also include performing a second etching process on second doped region 601 to form a second recess 901. It will be appreciated that a portion of dielectric layer 301 on the surface of second set of fins 203 is also removed by the second etching process.

Figure 10:
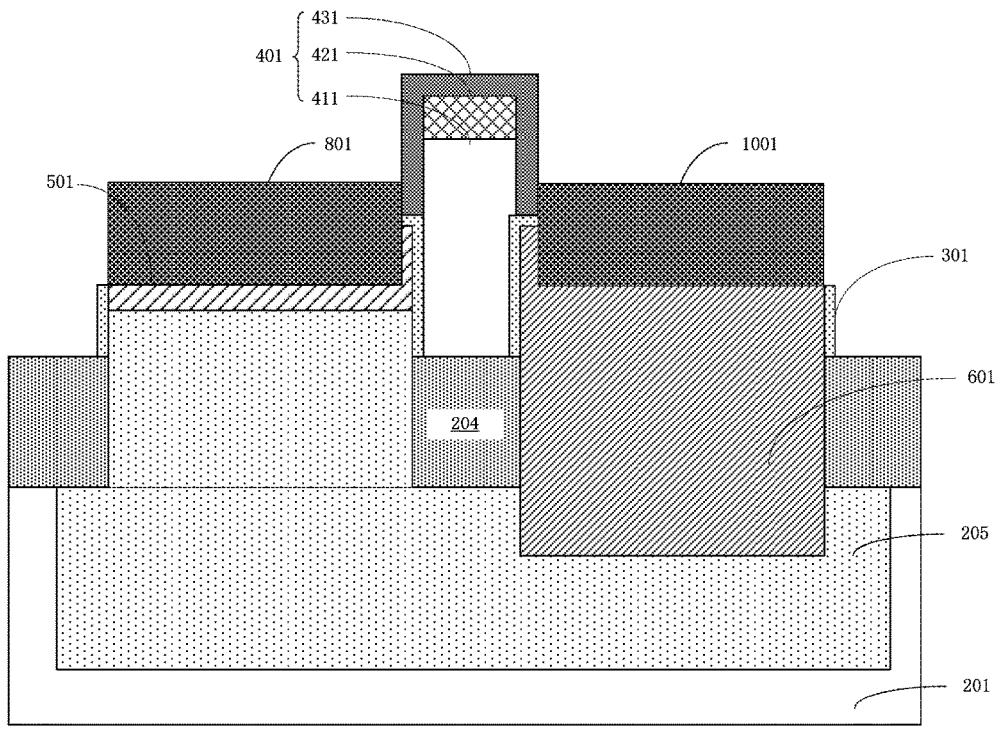
FIG. 10 is a cross-sectional view illustrating the forming of a second epitaxial region according to one embodiment of the present disclosure.

Next, referring to FIG. 10, a second semiconductor material is epitaxially grown in second recess 901 to form a second epitaxial region 1001. In one embodiment, second doped region 601 is an N-type conductivity region, and the second semiconductor material may be silicon (Si). In one embodiment, N-type dopants (e.g., phosphorous) may be implanted in-situ into the second semiconductor material when epitaxially growing the second semiconductor material.

It is to be understood that, although first epitaxial region 801 is first formed, and second epitaxial region 1001 is then formed in the example embodiment, the present invention is not limited thereto. For example, in other embodiments, second epitaxial region 1001 may be first formed, first epitaxial region 801 is then formed.

Embodiments of the present disclosure also provide a fin-type diode that may be manufactured using the above-described method.

Referring to FIG. 6, in one embodiment, the fin-type diode may include a substrate 201, a first set of fins 202 (e.g., including a plurality of first fins) and a second set of fins 203 (e.g., including a plurality of second fins) on substrate 201, and an isolation region 204 having an upper surface lower than an upper surface of first set of fins 202 and an upper surface of second set of fins 203. First set of fins 202 and second set of fins 203 are spaced apart from each other by isolation region 204.

The fin-type diode may also include a dielectric layer 301 on the surfaces of first set of fins 202 and second set of fins 203 above the upper surface of isolation region 204, and a well region 205 that is partially in substrate in substrate 201 and overlapped first set of fins 202 (referring to FIG. 2A), or well region 205 entirely in substrate 201 and adjacent to first set of fins 202 (referring to FIG. 2B).

The fin-type diode may also include a first doped region 501 including an upper portion of first set of fins 202 and adjacent to well region 205, a second doped region 601 including second set of fins 203 and a portion of substrate 201 under second set of fins 203. Second doped region 202 is adjacent to well region 205 and forms a junction having a junction interface disposed within substrate 201.

The fin-type diode may also include a dummy gate structure 401 covering a portion of dielectric layer 301 on a distal end of second set of fins and the upper surface or partially the upper surface of isolation region 204. First doped region 501 and second doped region 601 have different conductivity types. First doped region 501 and well region 205 have a same conductivity type. First doped region 501 has a dopant concentration greater than a dopant concentration of well region 205.

In one embodiment, dummy gate structure 401 may cover a portion of dielectric layer on a distal end of second set of fins 203, the upper surface of isolation region 204, and a portion of dielectric layer 301 on a distal end of first set of fins 202.

In one embodiment, dummy gate structure 401 may include a dummy gate 411, a hardmask layer 421 on dummy gate 411, and a spacer layer 431 on upper surface and sidewalls of hardmask layer 421 and on sidewalls of dummy gate 411.

In one embodiment, referring to FIGS. 7 and 8, first doped region 501 may include a first recess 701. In this embodiment, the fin-type diode may further include a first epitaxial region 801 formed by epitaxially growing a first semiconductor material in first recess 701.

In one embodiment, referring to FIGS. 9 and 10, second doped region 601 may include a second recess 901. In this embodiment, the fin-type diode may further include a second epitaxial region 1001 formed by epitaxially growing a second semiconductor material in second recess 901.

In summary, embodiments of the present disclosure provide a detailed description of a method for manufacturing a fin-type diode, and the fin-type diode fabricated using the described method. Well-known structures and processes have not been shown in detail in order not to obscure the embodiments.

It is to be understood that the above described embodiments are intended to be illustrative and not restrictive. Many embodiments will be apparent to those of skill in the art upon reviewing the above description. The scope of the invention should, therefore, be determined not with reference to the above description, but instead should be determined with reference to the appended claims along with their full scope of equivalents.

What is claimed is:

1. A method for manufacturing a fin-type diode, comprising:
   providing a substrate structure, the substrate structure comprising:
   a substrate;
   a first set of fins on the substrate;
   a second set of fins on the substrate;
   an isolation region disposed between the first set of fins and the second set of fins and having an upper surface lower than an upper surface of the first set of fins and an upper surface of the second set of fins;
   a well region partially in the substrate and overlapping the first set of fins and the second set of fins, or the well region entirely in the substrate and overlapping the first set of fins and the second set of fins;
   forming a dielectric layer on a surface of first set of fins and on a surface of the second set of fins above the upper surface of the isolation region;
   forming a dummy gate structure covering a portion of the dielectric layer on a distal end of the second set of fins and the upper surface or a portion of the upper surface of the isolation region;
   performing a first dopant implantation on the first set of fins to form a first doped region;
   performing a second dopant implantation on the second set of fins and a portion of the well region below the second set of fins using the dummy gate structure as a mask to form a second doped region;
   wherein the first doped region and the second doped region have different conductivity types;
   wherein the first doped region and the well region have a same conductivity type.

2. The method of claim 1, wherein the dummy gate structure further covers a portion of the dielectric layer on a distal end of the first set of fins.

3. The method of claim 1, wherein the dummy gate structure comprises:
   a dummy gate covering the portion of the dielectric layer on the distal end of the second set of fins and the upper surface or a portion of the upper surface of the isolation region;
   a hardmask layer on the dummy gate; and
   a spacer layer on an upper surface and sidewalls of the hardmask layer and sidewalls of the dummy gate.

4. The method of claim 1, wherein the first doped region is adjacent to the well region.

5. The method of claim 1, wherein the first doped region comprises a dopant concentration greater than a dopant concentration of the well region.

6. The method of claim 1, further comprising:
   etching a portion of the first doped region to form a first recess;
   epitaxially forming a first semiconductor material in the first recess to form a first epitaxial region.

7. The method of claim 6, further comprising:
   etching a portion of the second doped region to form a second recess;
   epitaxially forming a second semiconductor material in the second recess to form a second epitaxial region.

8. The method of claim 1, wherein providing the substrate structure comprises:
   providing an initial substrate structure including the substrate, the first set of fins and the second set of fins, and an insulating material layer on the substrate and the first set of fins and the second set of fins;
   performing an ion implantation on a portion of the initial substrate structure to form the well region; and
   removing a portion of the insulating material layer to form the isolation region.

9. The method of claim 1, wherein the first set of fins comprise a plurality of first fins; and the second set of fins comprise a plurality of second fins.

10. A fin-type diode, comprising:
    a substrate;
    a first set of fins on the substrate;
    a second set of fins on the substrate;
    an isolation region disposed between the first set of fins and the second set of fins and having an upper surface lower than an upper surface of the first set of fins and an upper surface of the second set of fins;
    a dielectric layer on a surface of the first set of fins above the isolation region and a surface of the second set of fins above the isolation region;
    a well region partially in the substrate and overlapping the first set of fins and the second set of fins, or the well region entirely in the substrate and overlapping the first set of fins and the second set of fins;
    a first doped region including an upper portion of the first set of fins and adjacent to the well region;
    a second doped region including the second set of fins and a portion of the well region below the second set of fins;

a junction formed by the second doped region and the well region and having a junction interface disposed in the substrate;

a dummy gate structure covering a portion of the dielectric layer on a distal end of the second set of fins and the upper surface or a portion of the upper surface of the isolation region;

wherein the first doped region and the second doped region have different conductivity types;

wherein the first doped region and the well region have a same conductivity type.

11. The fin-type diode of claim 10, wherein the dummy gate structure further covers a portion of the dielectric layer on a distal end of the first set of fins.

12. The fin-type diode of claim 10, wherein the dummy gate structure comprises:

a dummy gate covering the portion of the dielectric layer on the distal end of the second set of fins and the upper surface or a portion of the upper surface of the isolation region;

a hardmask layer on the dummy gate; and a spacer layer on an upper surface and sidewalls of the hardmask layer and sidewalls of the dummy gates.

13. The fin-type diode of claim 10, wherein the first doped region comprises a dopant concentration greater than a dopant concentration of the well region.

14. The fin-type diode of claim 10, further comprising:

a first recess in the first doped region;

a first epitaxial region including a first semiconductor material epitaxially grown in the first recess.

15. The fin-type diode of claim 14, further comprising:

a second recess in the second doped region;

a second epitaxial region including a second semiconductor material epitaxially grown in the second recess.

16. The fin-type diode of claim 10, wherein the first set of fins comprise a plurality of first fins; and the second set of fins comprise a plurality of second fins.

* * * * *